(12) United States Patent
Sullivan

(10) Patent No.: US 8,374,731 B1
(45) Date of Patent: Feb. 12, 2013

(54) COOLING SYSTEM

(75) Inventor: Douglas Richard Sullivan, Hopkinton, MA (US)

(73) Assignee: EMC Corporation, Hopkinton, MA (US)

( * ) Notice: Subject to any disclaimer, the term of this patent is extended or adjusted under 35 U.S.C. 154(b) by 653 days.

(21) Appl. No.: 12/343,517

(22) Filed: Dec. 24, 2008

(51) Int. Cl.
  *G05D 23/00* (2006.01)

(52) U.S. Cl. .............. 700/299; 700/12; 700/19; 700/82; 361/695

(58) Field of Classification Search .................... 700/11, 700/12, 19, 46, 82, 276–278, 280, 299, 300; 361/695
  See application file for complete search history.

(56) References Cited

U.S. PATENT DOCUMENTS

| | | | | |
|---|---|---|---|---|
| 4,756,473 A | * | 7/1988 | Takemae et al. | 236/49.3 |
| 5,834,856 A | * | 11/1998 | Tavallaei et al. | 307/64 |
| 6,101,459 A | * | 8/2000 | Tavallaei et al. | 702/132 |
| 6,127,663 A | * | 10/2000 | Jones | 219/553 |
| 6,163,087 A | * | 12/2000 | Huang et al. | 307/64 |
| 6,932,696 B2 | * | 8/2005 | Schwartz et al. | 454/184 |
| 7,085,134 B2 | * | 8/2006 | Foster et al. | 361/695 |
| 7,922,442 B2 | * | 4/2011 | Hopkins | 415/61 |
| 2003/0002250 A1 | * | 1/2003 | Yin | 361/687 |
| 2006/0161307 A1 | * | 7/2006 | Patel et al. | 700/277 |

OTHER PUBLICATIONS

U.S. Appl. No. 11/641,493, filed Dec. 19, 2006.

* cited by examiner

*Primary Examiner* — Sean Shechtman
(74) *Attorney, Agent, or Firm* — Krishnendu Gupta; R. Kevin Perkins; Konrad R. Lee

(57) ABSTRACT

A cooling system includes at least three fan units. A control unit operates each one of the at least three fan units, The control unit (a) operates only a selected two of the fan units, one of the at least three fan units being unselected and being inhibited from operation; (b) monitors operation of said selected two of fan units for a failure; and (c) upon detection of a failure in one of said selected two fan units, inhibits operation of the failed one of fan units and operating the unselected one of the at least three fan units.

4 Claims, 5 Drawing Sheets

COOLING SYSTEM

TECHNICAL FIELD

This invention relates generally to cooling systems and more particularly to cooling systems used in cabinets for storing electrical components.

BACKGROUND

As is known in the art, one technique used to cool electrical components in cabinets is with fans. The amount of airflow (and thus the cooling) through the cabinet is controlled by adjusting the speed of the fans. The individual fan speed is typically adjusted by varying the duty-cycle of a Pulse-Width-Modulated (PWM) control signal that is the control input to the fan and the actual fan speed is monitored by a tachometer producing a feedback control signal.

As is also known in the art, in some cabinets, electrical components are electrically interconnected through a backplane (sometimes also referred to as a midplane). One such an arrangement is used in data storage systems wherein disk drives are plugged into one side of the backplane and storage processors used to control data to and from the disk drives are plugged into the other side of the backplane. In such arrangement, a plurality of fan units is mounted to the rear, exposed region of the storage processor. With such an arrangement, when one of the fan units is detected as having failed, the technician can easily replace the failed one of the fan units.

In some application, however, the fan units must be mounted towards the rear, unexposed, region of the storage processor (i.e., the region within the cabinet nearer the backplane) thereby requiring that the storage processor be shut-down in order to remove the failed one of the fan units. This is obviously an undesirable situation.

SUMMARY

In accordance with the present invention, a cooling system is provided having at least three fan units and a control unit for operating each one of the at least three fan units in accordance with the following control strategy: (a) operating only a selected two of the fan units, one of the at least three fan units being unselected and being inhibited from operation; (b) monitoring operation of said selected two of fan units for a failure; and (c) upon detection of a failure in one of said selected two fan units, inhibiting operation of the failed one of fan units and operating the unselected one of the at least three fan units.

In one embodiment, the control strategy of the control unit includes periodically alternating the unselected one of the at least three fan units.

In one embodiment, the control strategy of the control unit includes periodically alternating the unselected one of the at least three fan units until detection of a failure in one of said selected two of the at least three fan units.

In one embodiment, a cabinet is provided for storing electrical components and a cooling system for cooling the electrical components. The cooling system includes at least three fan units, each one of the fan units having a fan for drawing external cooling air into the cabinet in response to a desired fan speed signal fed to the fan unit and for producing an actual fan speed signal representative of the actual fan speed. A sensor is disposed to sense the temperature of the cooling air drawn into the cabinet. A control unit is responsive to the sensed temperature and the actual fan speed signals produced by the at least three fan units for producing the desired fan speed signal for each one of the at least three fan units in accordance with the following control strategy: (a) generating the desired fan speed signal for only a selected two of the three fan units to operate only said selected two of the at least three fan units, one of the at least three fan units being unselected and being inhibited from operation; (b) monitoring operation of said selected two of the at least three fan units for a failure in one of the selected two of the at least three fan units; and (c) upon detection of a failure in one of said selected two of the at least three fan units, inhibiting operation of the failed one of the selected two of the at least three fan units and producing the desired fan speed signal for the unselected one of the at least three fan units to place in operation the unselected one of the at least three fan units.

In one embodiment, the cabinet includes: backplane; a plurality of disk drives plugged into one side of the backplane; and a storage processor having a rear portion plugged into an opposite side of the backplane, such storage processor having the at least three fan units and the control unit. The at least three fan units are proximate the rear portion of the storage processor.

In one embodiment, the control strategy of the fan control unit includes periodically alternating the unselected one of the at least three fan units.

In one embodiment, the control strategy of the control includes periodically alternating the unselected one of the at least three fan units until detection of a failure in one of said selected two of the at least three fan units.

In one embodiment a plurality of storage processor is plugged into the backplane. Each one of the storage processors executes the control strategy. Here, the control strategy includes that upon detection of a failure in at least two of the fan units in one of the plurality of storage processors, the strategy shuts down the electrical components in said one of the plurality of storage processors and operates a non-failed one of the fan units in said one of the plurality of storage processors under control of another one of the plurality of storage processors.

In another control strategy the control unit: (a) operates the fan units with normal operating fan speeds; (b) monitors operation of said fan units for a failure in one of the fan units; and (c) upon detection of a failure in one of said fan units, operates non-failed ones of the fan units at a fan speeds higher than said normal fan speeds.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
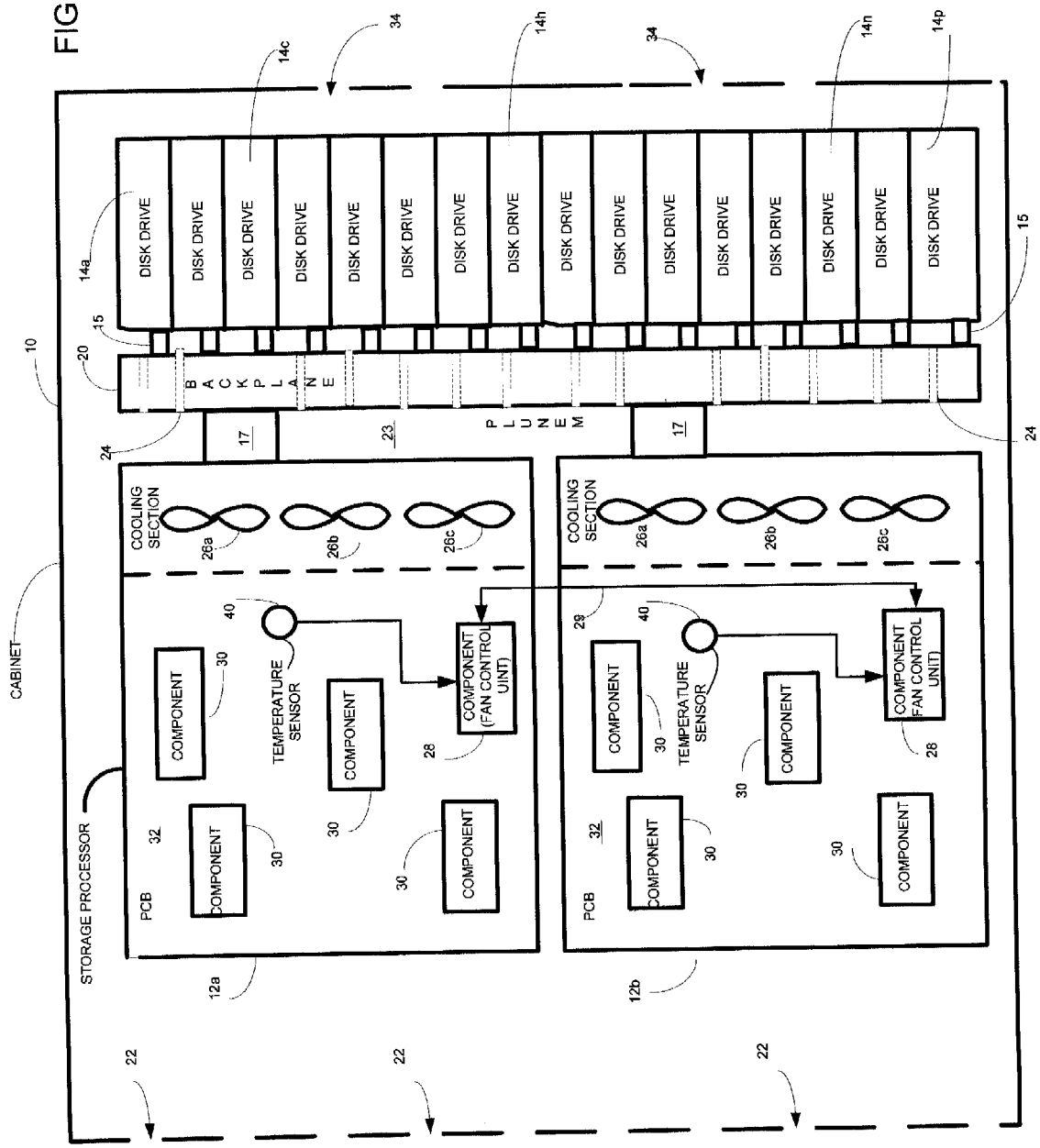
FIG. 1 is a diagram of a cabinet for storing electrical components and a cooling system for cooling the electrical components in accordance with the invention.

Referring now to FIG. 1, a cabinet 10 is shown for storing a pair of electrical chassis, here a pair of storage processors 12a, 12b, and a plurality of disk drives 14. The cabinet 10 includes a backplane 20. The plurality of disk drives 14a-14p is plugged into one side of the backplane 20 through electrical connectors 15 and the pair of hot swappable storage processors 12a, 12b has rear portions thereof plugged into an opposite side of the backplane 20 through electrical connectors 17. It is noted that the front of the cabinet 10 has air vents 22 and the backplane 20 has air passages 24 passing there through, as shown. It is noted that the plurality of disk drives 14a-14p is available for storage by both storage processors 12a, 12b via signals passing through the backplane 20.

Each one of the storage processors 12a, 12b has three fan units 26a, 26, 26c and a fan control unit 28 along with other electrical components 30 mounted on a printed circuit board (PCB) 32. The three fan units 26a, 26, 26c are proximate the rear portion of the storage processors 12a, 12b. The fan control units 28 in the storage processors 12a, 12b communicate with one another through a communication bus 29.

Figure 2:
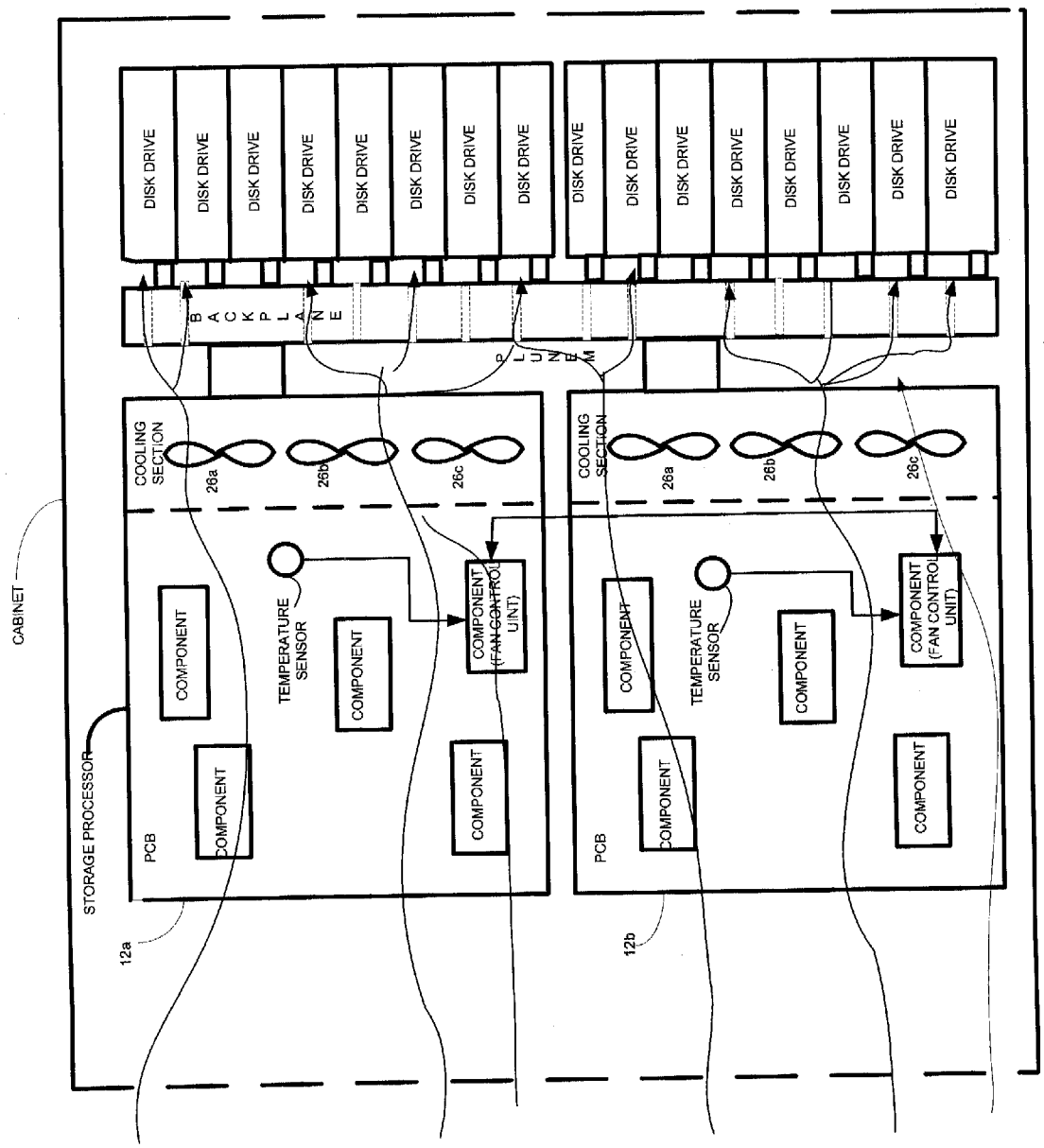
FIG. 2 is a diagram of the cabinet of FIG. 1 also showing paths of cooling air brought into the cabinet by fan units and used to cool the electrical components in a pair of storage processors and disk drives in the cabinet in accordance with the invention.

Each one of the fan units 26a, 26, 26c has a fan for, in this example, drawing external cooling air into the cabinet 10 over the PCBs 32 and the electrical components 30 thereon, then through air holes 24 passing through in the backplane 20 and then over the disk drives 14a-14p as shown in FIG. 2, and finally out air vents 34 at the rear of the cabinet 10, as shown in FIG. 2, where the airflow is indicated by the arrows 21. It should be understood that the air flow may be reversed; i.e., air entering the cabinet 10 from the side of the cabinet having the disk drives 14a-14p and exiting from the side of the cabinet 10 having the PCBs 32. It is noted that after passing through the storage processors 12a, 12b, the air is distributed, through a plenum 23 located between the back of the storage processors 12a, 12b and the front of the backplane 20, to the plurality of disk drives 14a-14p. As noted above, the plurality of disk drives 14a-14p is available for storage by both storage processors 12a, 12b via signals passing through the backplane 20.

Sensors 40 are disposed at various locations, here, only one sensor 40 being shown per storage processor 12a, 12b, to sense the temperature of the cooling air drawn into the cabinet 10 and in the environment of the storage processor 12a, 12b and the electrical components 30 thereon. It is noted that each one of the storage processors 12a, 12b may have more than one temperature sensor. For example, each storage processor may have 2 sensors which are polled once every second and a power supply for the processor may be sensed once every three seconds, for example. The fan speed may be adjusted in accordance with the hottest one of the reading one the three sensors, for example.

Figure 5:
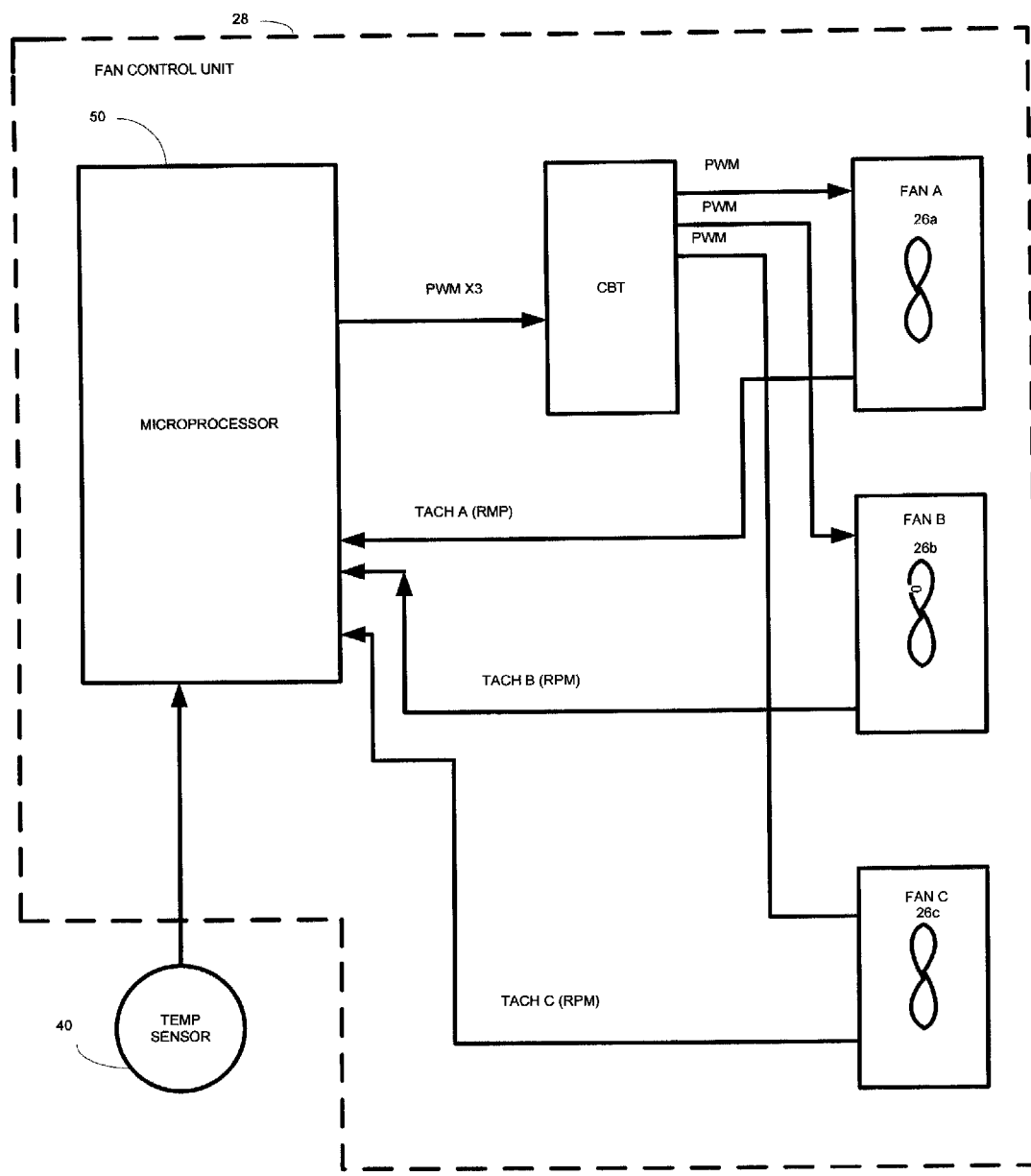
FIG. 5 is a block diagram of an exemplary of the fan control units used in the cooling system of FIG. 1.

The fan control unit 28 for an exemplary one of the storage processors 12a, 12b, here storage processor 12a is shown in FIG. 5. The fan control unit 28 includes a microprocessor 50 responsive to the temperature signal produced by the temperature sensor 40. The microprocessor 50 produces desired fan speed signals (PWM) for the three fan units 26a, 26, 26c.

The desired fan speed signals are fed to the fan units 26a, 26b and 26c through a crossbar technology switch (CBT) in responsive to the sensed temperature and the actual fan speed signals produced by each one of the three fan units 26a, 26, 26c, the fan control unit 28 produces a desired fan speed signal, here a PWM signal, for each one of the three fan units 26a, 26, 26c in accordance with the following control strategy:

(a) operate only said selected two of the three fan units (in his example units 26a and 26c), one of the three fan units being unselected (in this example unit 26b) and being inhibited from operation;

(b) monitor operation of said selected two of the three fan units (in his example units 26a and 26c) for a failure in one of the selected two of the three fan units; and (c) upon detection of a failure in one of said selected two of the three fan units (for example, in this example unit 26a), inhibit operation of the failed one of the selected two of the three fan units (in this example units 26a) and producing the desired fan speed signal for the unselected one of the at least three fan units (in this example unit 26b) to place in operation the unselected one of the at least three fan units (in this example unit 26b). More particularly, the control strategy of the control includes periodically alternating the unselected one of the at least three fan units. Still more particularly, the control strategy of the control includes periodically alternating the unselected one of the at least three fan units until detection of a failure in one of said selected two of the at least three fan units. Thus, for example, initially the selected fan unites are units 26a and 26c, then, after a predetermined period of time the selected fan units are 26b and 26c, and then after a predetermined period of time the selected fan units are 26a, 26b, etc.)

It is first noted that the control unit 28 in one of the storage processors 12a, 12b operates, during normal operation (i.e., when both storage processors 12 are operational) independently of the other one of the storage processors 12. However, if the fan control unit 28 in one of the storage processors 12a, 12b fails, an "OK" signal normally transmitted between the processors 12a, 12b via bus 29 is interrupted (FIG. 1) so that the non-failed one of the fan control units operates the fans connected to it at maximum fan speed independent of the temperature. For example, if the fan control unit 28 in storage processor 12b fails, the fan control unit 28 in storage processor 12a operates the fans in such storage processor 12a at maximum fan speed independent of the temperature in the storage processor 12a.

Figure 4:
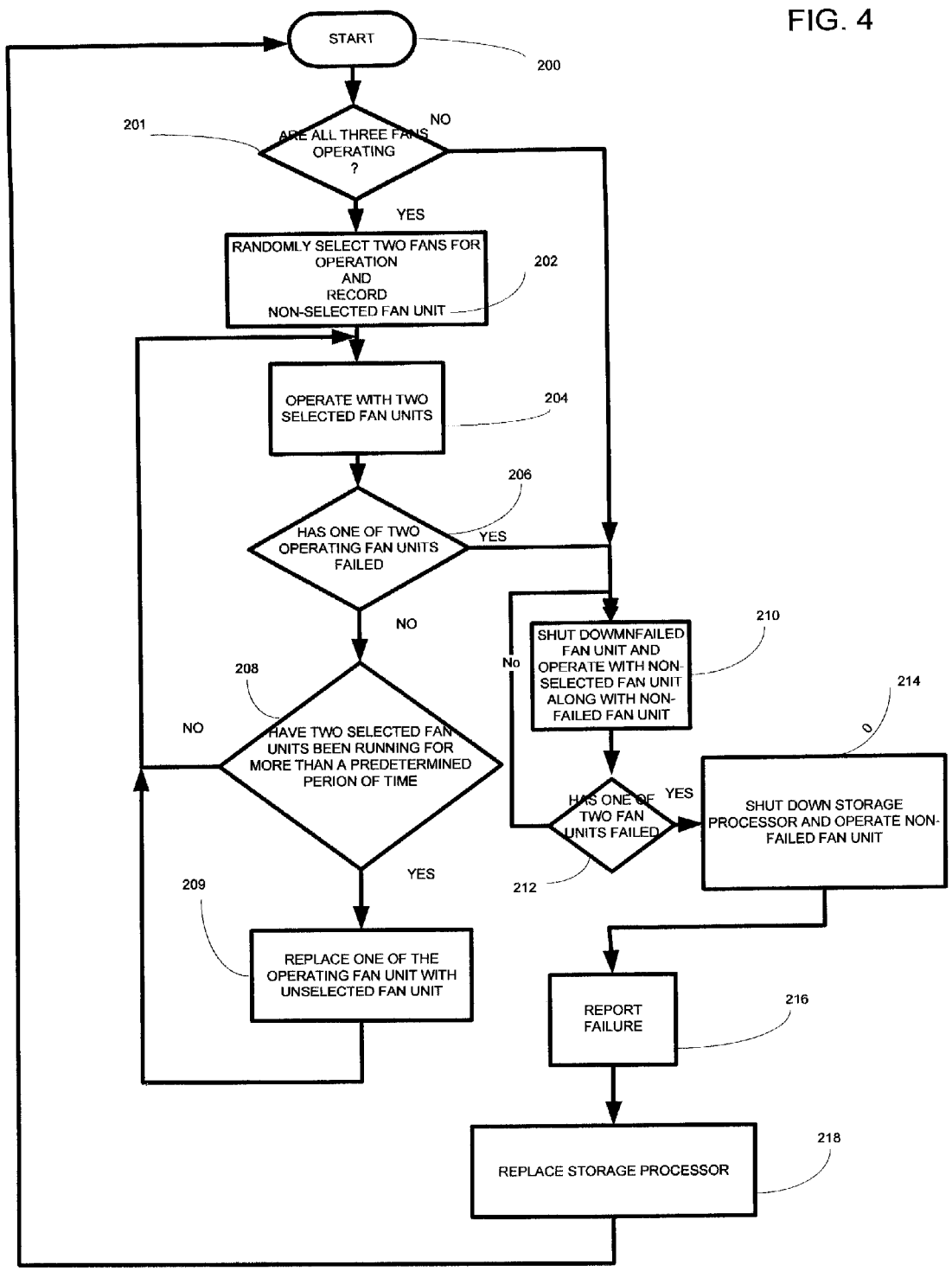
FIG. 4 is a flowchart of a control strategy used by a fan control unit in each one of the storage processors in controlling operation of the fan units in each one of the storage processors.

During normal operation when both storage processors 12a and 12b are operating properly, the selection of the two fans changes over time. Also, if during normal operation when both storage processors 12 and 12b are operating properly, during one period of time of normal operation the upper one of the storage processors 12a selects fan units 26a and 26b, the lower one of the storage processors 12b may select fan units 26b and 26c A flowchart of the control strategy is shown in FIG. 4. Consider operation of an exemplary one of the storage processors 12a, 12b, here for example storage processor 12a, after the storage processor 12a is started (Step 200), the fan control unit 28 therein checks to determine whether all three fan units 26a, 26, 26c are operating properly, Step 201. If all three units 26a, 26, 26c are operating properly, the fan control unit 28 randomly selects two of the three fan units 26a, 26, 26c for operation, records the non-selected one of the three fan units 26a, 26, 26c (Step 202), and operates the two selected ones of the fan units 26a, 26, 26c and the fan control unit 28. The fan control unit 28 monitors the operation of the selected two fan units 26a, 26, 26c (Step 206). If it has not detected that one of the two selected fan units 26a, 26, 26c has not failed, the fan control unit 28 detects whether two selected fan units 26a, 26, 26c has been running for more than a predetermined time, Step 208. If so, the fan control unit replaces one of the two operating fan units with the unselected fan unit and the process returns to Step 204, Step 209.

Figure 3:
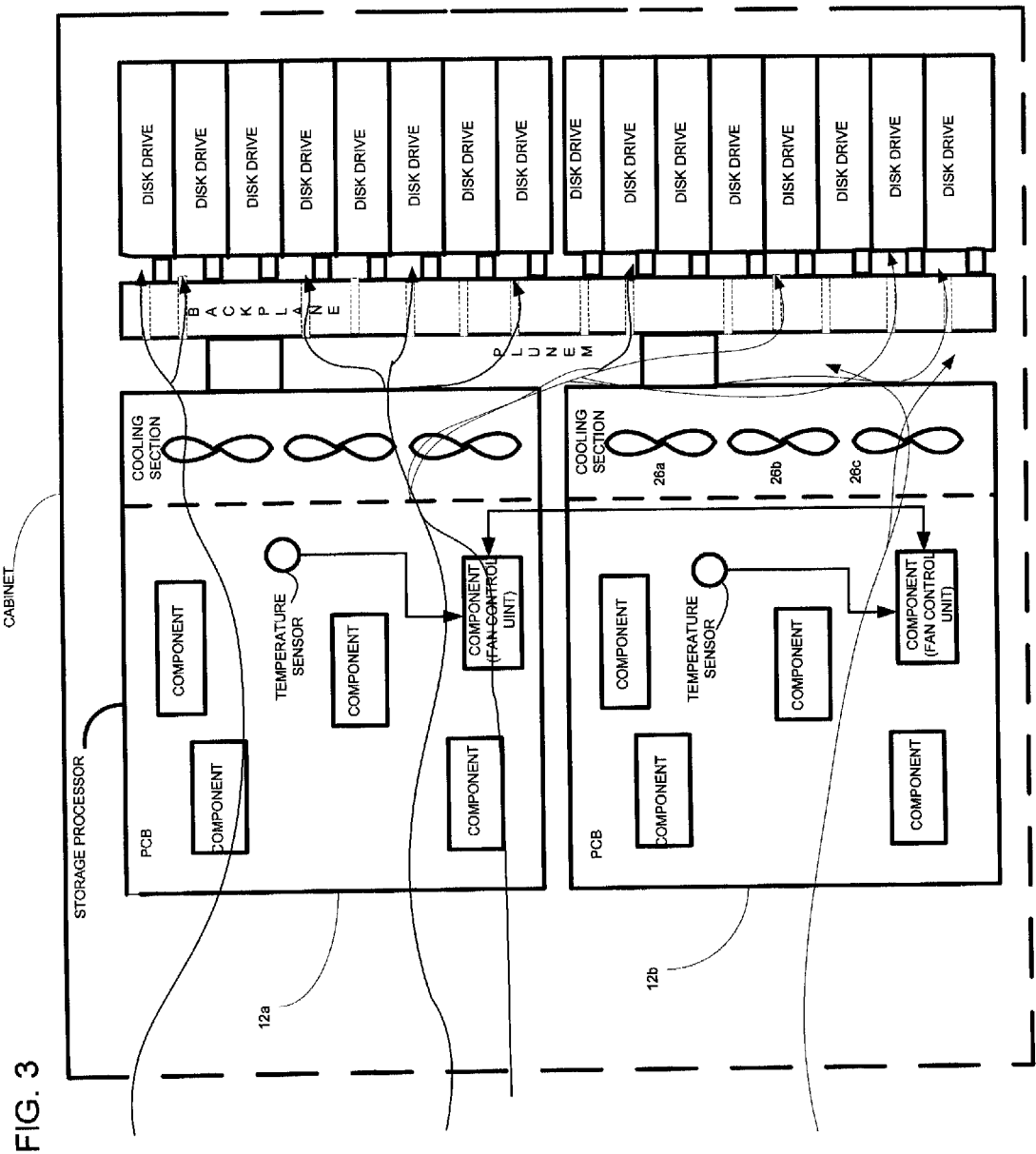
FIG. 3 is a diagram of the cabinet of FIG. 1 also showing paths of cooling air brought into the cabinet by fan units and used to cool the electrical components in the cabinet when fan units in one the a pair of storage processor in the cabinet fail.

On the other hand, if in either Step 201 or Step 206 the fan control unit 28 had detected that one of the two selected fan units 26a, 26, 26c has failed, the fan control unit 28 shuts down the failed one of the selected two fan units 26a, 26, 26c and selects and operates the unselected one of the three fan units 26a, 26, 26c along with the non-failed one of the previously selected fan units 26a, 26, 26c (Steps 206, 210). Thus, here again two fan units operate. The fan control unit 28 monitors the operation of the two now operating fan units (Step 212) and if one of these two fan units fails the fan control unit 28 in storage processor 12a removes power from the electrical components 30 of the storage processor 12a to shut them down while stand-by power remains to power the fan control unit 28 in such storage processor 12a, Step 214), the shut down condition is reported (Step 216) and the storage processor 12a is hot swapped with a new storage processor 12 (Step 218). As noted above, the absence of the "OK" signal to the fan control unit 28 in the storage processors 12b via the communication bus 29 (FIG. 1) the fan control unit 28 in storage processor 12b operates the fans in storage processor 12b at maximum fan speed independent of the temperature sensed by the temperature sensor 40 in storage processor 12b As noted above, the plurality of disk drives 14a-12p is available for storage by both storage processors 12a, 12b via signals passing through the backplane 20. It is noted that during the time period that one of the two storage processors 12a, 12b has the electrical components 30 therein shutdown, the shutdown processor 12a, 12b has still has one non-failed fan unit. Thus, even though the electrical components 30 of storage processor 12a, 12b with the two failed fan units 26a, 26, 26c are shutdown, the non-failed one of the fan units therein may be operated to assist in cooling the plurality of disk drives 14a-12p. Thus, the system continues to operate with the two fan units of the operating storage processor 12a, 12b to cool the electrical components therein and the disk drives 14a-14p along with the non-failed one of the fan units of the shutdown storage processor 12a, 12b, as shown in FIG. 3 which thereby assists in cooling the disk drives 14a-14p. The non-failed one of the shutdown storage processor 12 is provided control signal from, as noted above, a standby voltage to run the fans, consequently when the components on a PCB is shutdown fan control unit 28 therein operates since it can be cooled by convection (i.e. no fans running worst case). Thus, upon detection of a failure in at least two of the fan units in one of the pair of storage processors 12a, 12b, the electrical components 30 in the operating (non-shutdown one of the storage processors 12) continues to operate a non-failed one of the fan units 26a, 26, 26c in the one of the pair of storage processors 12 having the electrical components 30 thereof shutdown (Step 214, FIG. 4). Thus, in FIG. 3, assume the lower one of the storage processors 12a, 12b, here 12b has fan units 26a and 26b as failed fan units, fan unit 26c in the lower one of the storage processors 12b may be operated under the control of the fan control unit 28 in the upper one of the storage processors 12a.

A number of embodiments of the invention have been described. Nevertheless, it will be understood that various modifications may be made without departing from the spirit and scope of the invention. For example, more than three fan nuts may be used in a storage processor (for example, in a storage processor four fan units, three fan units may be selected for operation while one is unselected until a failure in one of the selected three selected fan units). Also, in another control strategy, the control unit: (a) operates the fan units with normal operating fan speeds; (b) monitors operation of said fan units for a failure in one of the fan units; and (c) upon detection of a failure in one of said fan units, operates non-failed ones of the fan units at a fan speeds higher than said normal speeds.

A number of embodiments of the invention have been described. Nevertheless, it will be understood that various modifications may be made without departing from the spirit and scope of the invention. For example, more than three fan nuts may be used in a storage processor (for example, in a storage processor four fan units, three fan units may be selected for operation while one is unselected until a failure in one of the selected three selected fan units). Accordingly, other embodiments are within the scope of the following claims.

What is claimed is:

1. A cabinet for storing electrical components and a cooling system for cooling the electrical components, such cooling system comprising:
   a sensor disposed to sense the temperature of the cooling air drawn into the cabinet;
   a pair of electrical chassis, each one of the chassis having:
      electrical component;
      at least three fan units, each one of the fan units having a fan for drawing external cooling air into the cabinet in response to a desired fan speed signal fed to the fan unit and for producing an actual fan speed signal representative of the actual fan speed;
      a fan control unit, responsive to the sensed temperature and the actual fan speed signals produced by the at least three fan units for producing the desired fan speed signal for each one of the at least three fan units, such fan control unit producing signals to:
         (a) generate the desired fan speed signal for only a selected two of the at least three fan units to operate only said selected two of the at least three fan units, one of the at least three fan units being unselected and being inhibited from operation while monitoring operation of said selected two of the at least three fan units for a failure in one of the selected two of the at least three fan units;
         (b) upon detection of a failure in one of said selected two of the at least three fan units, the fan control unit signals inhibit operation of the failed one of the selected two of the at least three fan units and producing the desired fan speed signal for the unselected one of the at least three fan units to place in operation the unselected one of the at least three fan units; and
         (c) upon detection of a failure in at least two of the fan units in such one of the pair of chassis, the fan control unit signals removes power from the electrical component to shut such component down while stand-by power remains to power the fan control unit.

2. The cabinet recited in claim 1 wherein such cabinet includes:
   a backplane;
   a plurality of disk drives plugged into one side of the backplane;
   wherein the plurality of chassis having rear portions plugged into an opposite side of the backplane, each one of the plurality of chassis having the at least three fan units and the control unit; and wherein the at least three fan units are proximate the rear portion of the chassis.

3. The cabinet recited in claim 1 wherein the fan control unit signals periodically alternates the unselected one of the at least three fan units.

4. The cabinet recited in claim 1 wherein fan control unit signals periodically alternates the unselected one of the at least three fan units until detection of a failure in one of said selected two of the at least three fan units.

* * * * *